United States Patent
Doris et al.

(10) Patent No.: US 7,459,752 B2
(45) Date of Patent: Dec. 2, 2008

(54) ULTRA THIN BODY FULLY-DEPLETED SOI MOSFETS

(75) Inventors: Bruce B. Doris, Brewster, NY (US); Meikei Ieong, Wappingers Falls, NY (US); Zhibin Ren, Hopewell Junction, NY (US); Paul M. Solomon, Yorktown Heights, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 11/473,757

(22) Filed: Jun. 23, 2006

(65) Prior Publication Data

US 2006/0237791 A1    Oct. 26, 2006

Related U.S. Application Data

(63) Continuation of application No. 10/710,273, filed on Jun. 30, 2004, now Pat. No. 7,091,069.

(51) Int. Cl.
*H01L 27/12* (2006.01)
(52) U.S. Cl. ........................ 257/348; 257/347; 257/368; 257/369; 257/327; 257/E29.117
(58) Field of Classification Search ................ 257/348, 257/347, E21.445, E21.444, 368, 369, 327, 257/E29.117, E21.415
See application file for complete search history.

(56) References Cited

U.S. PATENT DOCUMENTS

| | | | |
|---|---|---|---|
| 5,019,882 A | 5/1991 | Solomon et al. | |
| 5,192,697 A | 3/1993 | Leong | |
| 5,413,950 A | 5/1995 | Chen et al. | |
| 5,999,056 A | 12/1999 | Fong | |
| 6,025,267 A | 2/2000 | Pey et al. | |
| 6,271,133 B1 | 8/2001 | Lim et al. | |
| 6,333,247 B1 | 12/2001 | Chan et al. | |
| 6,335,253 B1 | 1/2002 | Chong et al. | |
| 6,339,002 B1 | 1/2002 | Chan et al. | |
| 6,365,446 B1 | 4/2002 | Chong et al. | |
| 6,372,557 B1 | 4/2002 | Leong | |
| 6,509,221 B1 | 1/2003 | Doris et al. | |

(Continued)

*Primary Examiner*—Sue A. Purvis
*Assistant Examiner*—Fazli Erdem
(74) *Attorney, Agent, or Firm*—Scully, Scott, Murphy & Presser, P.C.; Joseph P. Abate, Esq.

(57) ABSTRACT

Ultra thin body fully-depleted silicon-on-insulator (SOI) metal-oxide-semiconductor field-effect-transistors (MOSFETs) in which the SOI thickness changes with gate-length variations thereby minimizing the threshold voltage variations that are typically caused by SOI thickness and gate-length variations are provided. Such a SOI MOSFET may include a SOI substrate having a SOI layer in which a first portion thereof has a thickness of less than 20 nm; a gate including a gate dielectric and a gate electrode located atop the first portion of the SOI layer having the thickness, the gate electrode having an upper surface and a bottom surface that have the same length or the bottom surface has a length that is greater than the upper surface; and source and drain diffusion regions located in a second portion of the SOI layer that is adjacent to the first portion, and the second portion of the SOI layer is thicker than the first portion.

18 Claims, 11 Drawing Sheets

U.S. PATENT DOCUMENTS

| | | |
|---|---|---|
| 6,509,234 B1 * | 1/2003 | Krivokapic ................. 438/270 |
| 6,531,365 B2 | 3/2003 | Dokumaci et al. |
| 6,534,388 B1 | 3/2003 | Lin et al. |
| 6,555,880 B2 | 4/2003 | Cabral, Jr. et al. |
| 6,580,132 B1 | 6/2003 | Chan et al. |
| 6,586,289 B1 | 7/2003 | Dokumaci et al. |
| 6,603,181 B2 | 8/2003 | Solomon et al. |
| 6,624,489 B2 | 9/2003 | Chong et al. |
| 6,645,861 B2 | 11/2003 | Cabral, Jr. et al. |
| 6,716,708 B2 | 4/2004 | Cabral, Jr. et al. |
| 6,841,831 B2 | 1/2005 | Hanafi et al. |
| 2002/0022366 A1 | 2/2002 | Cabral, Jr. et al. |
| 2002/0024058 A1 | 2/2002 | Marshall et al. |
| 2002/0031909 A1 | 3/2002 | Cabral, Jr. et al. |
| 2002/0042183 A1 | 4/2002 | Chan et al. |
| 2002/0094643 A1 | 7/2002 | Solomon et al. |
| 2002/0098689 A1 | 7/2002 | Chong et al. |
| 2002/0155690 A1 | 10/2002 | Cabral, Jr. et al. |
| 2002/0185691 A1 | 12/2002 | Cabral, Jr. et al. |
| 2002/0197839 A1 | 12/2002 | Dokumaci et al. |
| 2003/0132487 A1 | 7/2003 | Cabral, Jr. et al. |
| 2003/0132492 A1 | 7/2003 | Solomon et al. |
| 2003/0162388 A1 | 8/2003 | Dokumaci et al. |
| 2004/0094804 A1 | 5/2004 | Amos et al. |
| 2004/0108598 A1 | 6/2004 | Cabral, Jr. et al. |

* cited by examiner

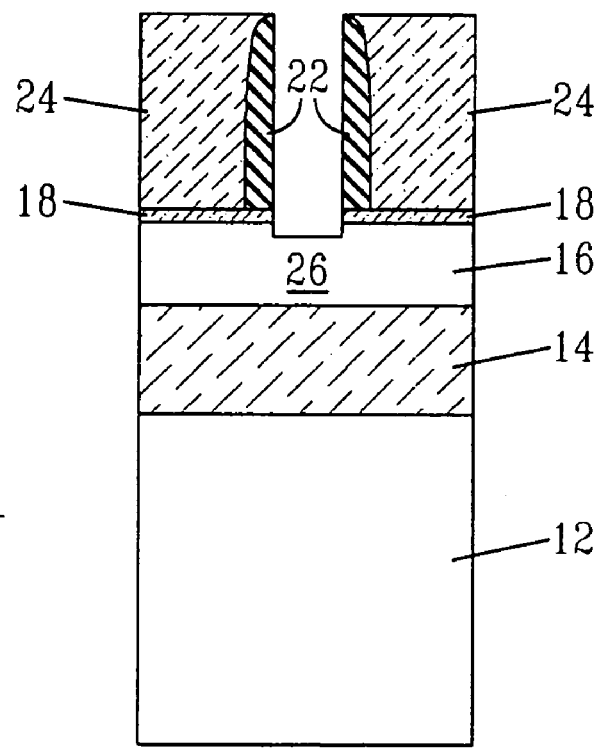
FIG.6Aii
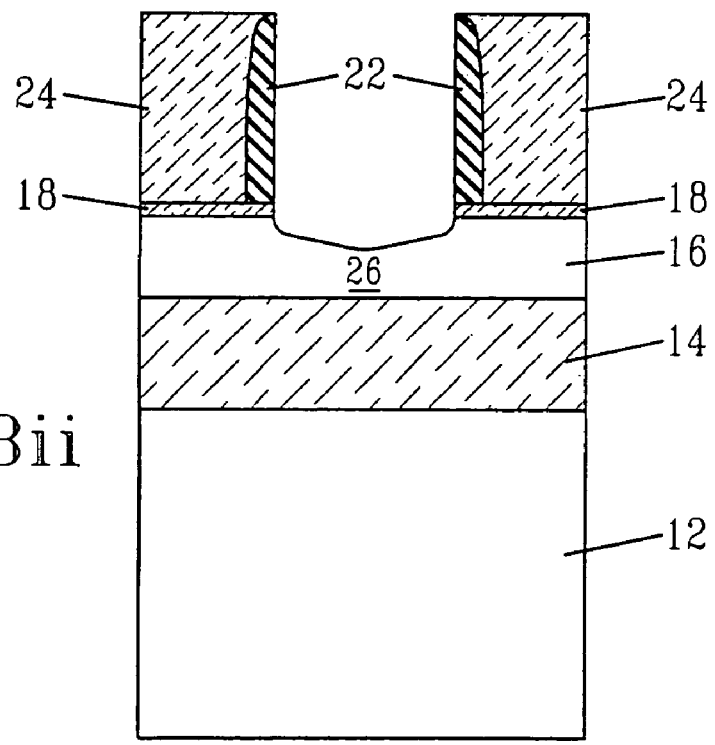
FIG.6Bii

FIG.6Cii

ULTRA THIN BODY FULLY-DEPLETED SOI MOSFETS

RELATED APPLICATIONS

This application is a continuation application of U.S. Ser. No. 10/710,273, filed Jun. 30, 2004 now U.S. Pat. No. 7,091,069.

FIELD OF THE INVENTION

The present invention relates to semiconductor integrated circuit devices as well as their fabrication, and more particularly to ultra thin body, e.g., channel, fully-depleted silicon-on-insulator (SOI) metal oxide semiconductor field effect transistor (MOSFET) devices in which the threshold voltage variation of each device is controlled.

BACKGROUND OF THE INVENTION

In semiconductor processing, silicon-on-insulator (SOI) technology is becoming increasingly important since it permits the formation of high-speed integrated circuits. In SOI technology, a buried insulating layer, especially a buried oxide, electrically isolates a top Si-containing layer from a bottom Si-containing substrate layer. The top Si-containing layer, which is oftentimes referred to in the art as the SOI layer, is generally the area in which active devices such as transistors are formed. Devices formed using SOI technology offer many advantages over the bulk counterparts including, for example, higher performance, absence of latch up, higher packing density and low voltage applications.

In the semiconductor industry, the SOI layer thickness has been scaled down in every SOI device technology generation. Current technology trends are for providing SOI devices that have ultra thin Si channels. Ultra thin Si channel devices, which are formed in the SOI layer, have demonstrated excellent scalibity. The term "ultra thin" is used throughout the present application to denote a channel region having a vertical thickness of less than about 20 nm.

It is also known that fully-depleted SOI MOSFET devices with doped channels typically have very large threshold voltage variations. The threshold voltage variations are effected by SOI thickness as well as well as the channel length variations that are a result of conventional device fabrication.

In conventional fully-depleted SOI devices, the silicon film thickness is usually less than or equal to half the depletion width of the bulk device. The surface potentials at the front and back interfaces are strongly coupled to each other and capacitively coupled to the front-gate and substrate through the front-gate dielectric and the buried oxide, respectively. Therefore, the potential throughout the silicon film, and hence the charge, is determined by the bias conditions on both the front-gate and the substrate. The large variation in threshold voltage mentioned above has prevented fully-depleted SOI MOSFETs to become mainstream manufacturable complementary metal oxide semiconductor (CMOS) technology. Because of the current trends in reducing the SOI thickness, partially depleted SOI devices are being pushed closer and closer to the fully-depleted mode.

SOI MOSFETs are often distinguished as partially depleted (PD) when the silicon film is thicker than the maximum gate depletion width, and fully developed (FD) when the silicon film is thin enough that the entire film is depleted before the threshold voltage condition is reached.

In the prior art, halo implantation can be used to create a device in which the channel-length is dependent upon the total charge doping concentration. A well-designed halo implant can create devices such that the channel doping is higher in short channel devices. As a result, the threshold voltage vs. gate length curve can be flatten out. Therefore, devices can be operated at much shorter channel lengths. This prior art method however cannot be extended any further because 1) the junction leakage current could be to high with high halo doping concentration; and 2) the doping fluctuation effect could dominate the threshold variations in narrow width devices.

In view of the prior art mentioned above, there is a need for providing a method of forming a fully-depleted SOI MOSFET device in which the threshold voltage variation with respect to SOI thickness and channel-length variations is minimized.

SUMMARY OF THE INVENTION

The present invention provides a method of creating ultra thin body fully-depleted SOI MOSFETs in which the SOI thickness changes with gate-length variations thereby minimizing the threshold voltage variations that are typically caused by SOI thickness and gate-length variations. This object is achieved in the present invention by using a replacement gate process in which nitrogen (or fluorine) is implanted to selectively retard (enhance) oxidation during formation of a recessed channel. A self-limited chemical oxide removal (COR) processing step can be used to improve the control in the recessed channel step.

If the channel is doped, the inventive method is designed such that the thickness of the SOI layer is increased with shorter channel lengths. If the channel is undoped or counter-doped, the inventive method is designed such that the thickness of the SOI layer is decreased with shorter channel lengths.

In broad terms, the method of the present invention comprises the steps of:

providing a SOI structure comprising a dummy gate that has an upper surface that is coplanar with an upper surface of a planarizing material, said dummy gate is located on a sacrificial oxide that is positioned atop a top Si-containing layer of a SOI substrate;

removing the dummy gate to provide a gate opening that exposes a portion of the underlying sacrificial oxide layer, said gate opening defining a device channel in said top Si-containing layer;

implanting nitrogen or fluorine ions into the device channel;

removing the sacrificial oxide layer to expose the device channel;

recessing the device channel to provide a recessed device channel; and forming the gate, including gate dielectric and gate electrode in said opening atop the recessed device channel.

Following the gate forming step, the planarizing dielectric is etched back and source/drain diffusion regions can be formed utilizing ion implantation and annealing processing steps.

In addition to the method described above, the present invention also contemplates the devices that are formed thereby. Specifically, the devices of the present invention comprise:

a silicon-on-insulator (SOI) substrate having a SOI layer in which a first portion thereof has a thickness of less than about 20 nm;

a gate including a gate dielectric and a gate electrode located atop the first portion of the SOI layer having said thickness; and source and drain diffusion regions located in a second portion of the SOI layer that is adjacent to said first portion, said second portion of the SOI layer is thicker than the first portion.

BRIEF DESCRIPTION OF THE DRAWINGS

FIGS. 6Ai-6Ci show that the shorter the channel length, the thinner the silicon film thickness. FIGS. 6Aii-6Cii show that the shorter the channel length, the thicker the silicon film.

DETAILED DESCRIPTION OF THE INVENTION

Figure 1:
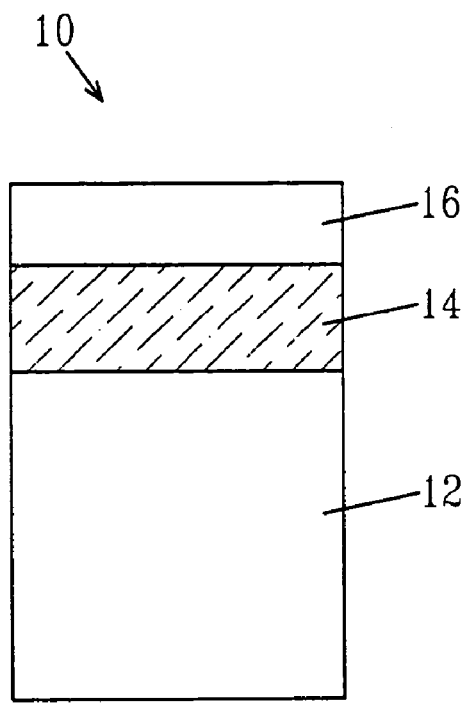
FIG. 1 is a pictorial representation (through a cross sectional view) illustrating an initial SOI substrate employed in the present invention.

The present invention, which provides a method for threshold voltage variations control in ultra thin fully-depleted SOI MOSFETs, will now be described in greater detail by referring to the drawings that accompany the present application.

Referring to FIG. 1 there is shown an initial SOI substrate 10 that can be employed in the present invention. The initial SOI substrate 10 includes a bottom Si-containing layer 12, a buried insulating layer 14, such as an oxide or nitride, located on the bottom Si-containing layer 12, and a top Si-containing layer 16, i.e., the SOI layer, located on the buried insulating layer 14. The term "Si-containing layer" denotes any material that includes silicon. Illustrative examples of Si-containing materials include, but are not limited to: Si, SiGe, SiGeC, SiC, polysilicon, i.e., polySi, epitaxial silicon, i.e., epi Si, amorphous silicon, i.e., a:Si, and multilayers thereof. Typically, layers 12 and 16 of the SOI substrate 10 are both comprised of Si.

The SOI layer 16 of the initial SOI substrate 10 is typically, but not always, a doped layer, which may contain an n- or p-type dopant. Doping can be introduced into the SOI layer 16 prior to, or after formation of the SOI substrate 10. The dopant concentration within the SOI layer 16 is typically from about 1E17 to about 1E19 atoms/cm$^3$.

The SOI layer 16 of the SOI substrate 10 may have a variable thickness, which is dependent on the technique that is used in forming the SOI substrate 10. Typically, however, the top Si-containing layer 16 of the SOI substrate 10 has a thickness from about 10 to about 1000 nm, with a thickness from about 50 to about 500 nm being more typical. The thickness of the buried insulating layer 14 may also vary depending upon the technique used in fabricating the SOI substrate 10. Typically, however, the buried insulating layer 14 of the present invention has a thickness from about 100 to about 1000 nm, with a buried insulating thickness from about 120 to about 200 nm being more typical. The thickness of the Si-containing substrate layer 12 of the SOI substrate 10 is inconsequential to the present invention.

The initial SOI substrate 10 can be formed using a layer transfer process such as, a bonding process. Alternatively, a technique referred to as separation by implanted oxygen (SI-MOX) wherein ions, typically oxygen or nitrogen, are implanted into a bulk Si-containing substrate and then the substrate containing the implanted ions is annealed under conditions that are capable of forming a buried insulating layer 14 can be employed.

After providing the substrate, a pad oxide layer (not shown) is typically formed on an upper exposed surface of the SOI substrate 10 by a thermal oxidation process that is well known to those skilled in the art. Alternatively, the pad oxide layer may be formed by a deposition process, such as chemical vapor deposition (CVD), plasma-assisted chemical vapor deposition, evaporation or solution deposition. The pad oxide layer formed at this point of the present invention typically has a thickness from about 5 to about 20 nm.

Next, isolation trench regions (not shown) are formed into the SOI substrate 10 by first forming a hardmask (not shown) in the surface of the pad oxide layer and then utilizing lithography and etching. The lithographic step employed in the present invention includes applying a photoresist (not shown) to the hardmask; exposing the photoresist to a pattern of radiation (in the present case a trench pattern is employed); and developing the pattern into the photoresist utilizing a conventional resist developer. The etching step, which is used to transfer the trench pattern first into the hardmask and then into the pad oxide layer and the SOI substrate 10, includes any conventional dry etching process such as reactive-ion etching, ion beam etching, plasma etching, laser ablation or any combination thereof. A single etching process may be employed, or alternatively, more than one etching process may be employed to form trenches in the SOI substrate 10. After the pattern has been transferred into the hardmask, the photoresist is typically removed from the structure and then pattern transfer continues using the hardmask as an etch mask. The depth of the trenches formed may stop within the SOI layer 16 of the SOI substrate 10, or it may extend down to the buried insulating layer 14.

After trenches have been formed in the SOI substrate, the trenches are filled with a trench dielectric material such as high-density plasma (HDP) oxide or TEOS (tetraethylorthosilicate) using conventional deposition processes well known to those skilled in the art. The filled trenches form trench isolation regions in the structure that serve to isolate various device regions from each other. In some embodiments of the present invention, the walls of the trenches are lined with a liner material, such as $SiO_2$ or $Si_3N_4$, prior to filling with the trench fill material. After the filling process, a conventional planarization process and/or densification may be performed on the structure. The planarization process stops on the hardmask and thereafter the hardmask is typically removed by utilizing an etching process that selectively removes the hardmask material from the structure.

Next, the pad oxide layer is removed from the surface of substrate 10 using a stripping process that is highly selective in removing oxide and thereafter sacrificial oxide layer 18 is formed on the SOI layer 16 of the SOI substrate 10 utilizing a conventional thermal oxidation process. The structure including the sacrificial oxide layer 18 is shown, for example, in FIG. 2. Sacrificial oxide layer 18 formed at this point of the inventive process typically has a thickness from about 3 to about 20 nm, with a thickness from about 3 to about 6 nm being highly preferred. Note that the sacrificial oxide layer 18 is grown substantially over the Si-containing regions of the SOI substrate 10, not atop trench isolation regions that may be formed therein.

Figure 2:
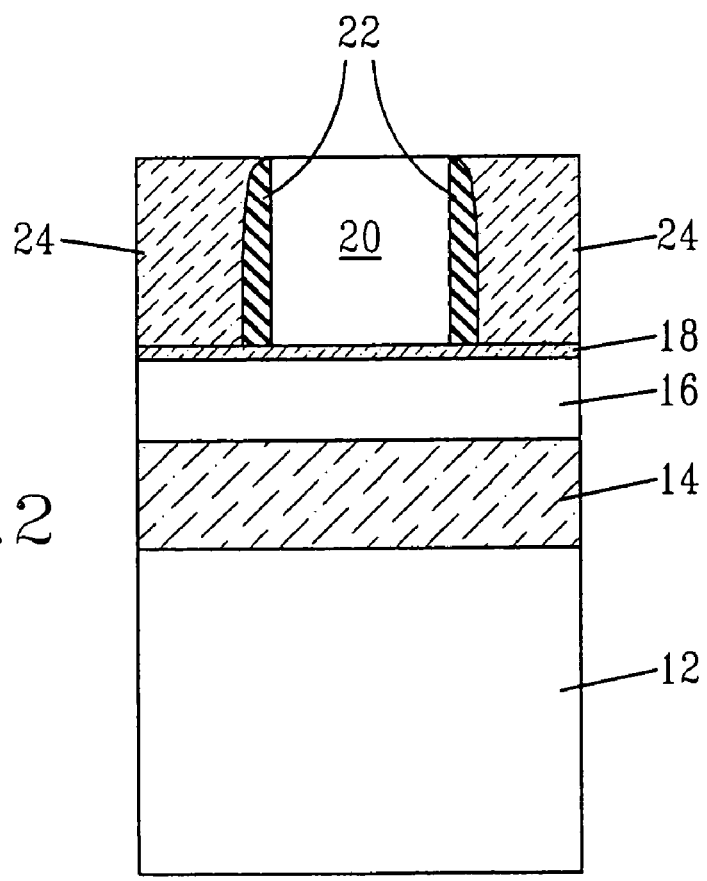
FIG. 2 is a pictorial representation (through a cross sectional view) illustrating the initial SOI substrate of FIG. 1 after forming a dummy gate that has an upper surface that is coplanar with an upper surface of a planarizing material atop a sacrificial oxide layer that is formed on the SOI substrate.

A dummy gate 20 comprising a sacrificial polysilicon region or other related material is then formed on a portion of the sacrificial oxide layer 18 providing the structure also shown, for example, in FIG. 2 The dummy gate 20 is formed by first providing a sacrificial polysilicon layer or other related material atop the sacrificial oxide layer 18 utilizing a conventional deposition process such as CVD or PECVD. The sacrificial polysilicon layer or other related material is then patterned by lithography and etching.

FIG. 2 also shows the structure after an outer insulating spacer 22 is formed on each sidewall of the dummy gate 20. This step of forming the outer insulating spacer 22 is optional. Outer insulating spacers 22, which comprise a nitride, oxynitride or a combination thereof, are formed by deposition and etching. Outer insulating spacers 22 may have a variable thickness, but typically outer insulating spacers 22 have a thickness, as measured from a bottom surface, from about 10 to about 30 nm.

It should be noted that the present invention is not limited to forming just a single dummy gate 20 on the surface of the sacrificial oxide layer 18. Instead, the present invention works equally well when a plurality of dummy gates 20 are formed. The formation of a plurality of dummy gates 20 will allow for the formation of a plurality of MOSFETs across the surface of the SOI substrate 10. More than one outer insulating spacer is also contemplated herein.

Next, and as also shown in FIG. 2, a planarizing material 24 such as a high-density plasma (HDP) oxide or an oxide from tetraethylorthosilicate (TEOS) is deposited and planarized such that an upper surface of the planarizing material 24 is coplanar with an upper surface of the dummy gate 20.

Figure 3:
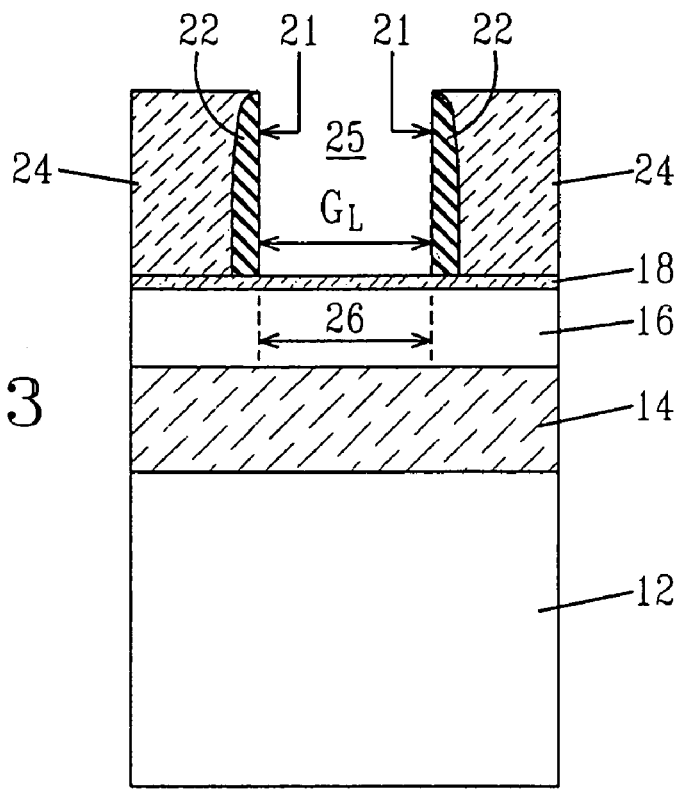
FIG. 3 is a pictorial representation (through a cross sectional view) illustrating the structure of FIG. 2 after removing the dummy gate.

Next, the dummy gate 20, i.e., sacrificial polysilicon region or other related material, is removed from the structure using chemical downstream etching or KOH stopping atop the sacrificial oxide layer 18. The resultant structure, which includes a gate opening 25 that is formed after this step has been performed, is shown, for example, in FIG 3. Note that the inner edges 21 of the outer insulating spacers 22, which define the boundaries of the gate opening 25, also define the length $G_L$ of device channel 26. As shown, the device channel 26 is located in the SOI layer 16.

If desired, the device channel length can be reduced by forming an inner insulating spacer (not shown) on each inner edge 21 of the outer insulating spacer 22. The inner insulating spacer may be comprised of the same or different insulating material as the outer insulating spacer 22. The inner insulating spacer may be used with, or without, the outer insulating spacer 22. In embodiments in which the outer spacer is not present, the inner spacer is used in defining the channel length. The inner spacer is formed by deposition and etching.

Device channel (i.e., body region) 26 may optionally be doped by utilizing an ion implantation step and an annealing step. The conditions used in forming the doped device channel 26 are well known to those skilled in the art. The annealing step serves to activate the dopants within the device channel 26. For example, the device channel 26 may be ion implanted with a p-type dopant using any ion dosage such 1E12 to about 5E13 atoms/cm$^2$ and annealed at any conditions such as, for example, 1000° C., for 5 seconds in Ar. An n-type dopant is also contemplated herein.

Figure 4A:
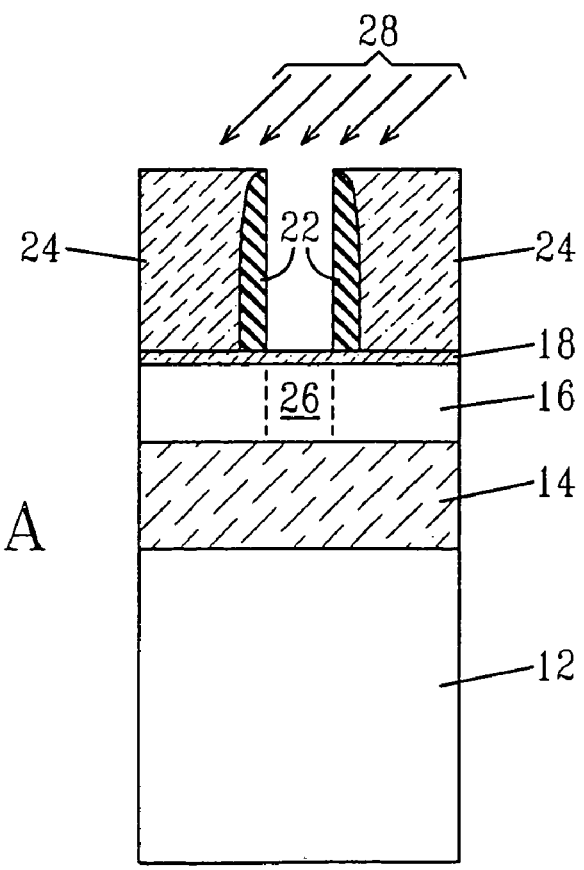
FIGS. 4A-4C are pictorial representations (through cross sectional views) illustrating the structure of FIG. 3 during ion implantation into the channel region; short, intermediate and long channel lengths, respectively, are shown.
Figure 4B:
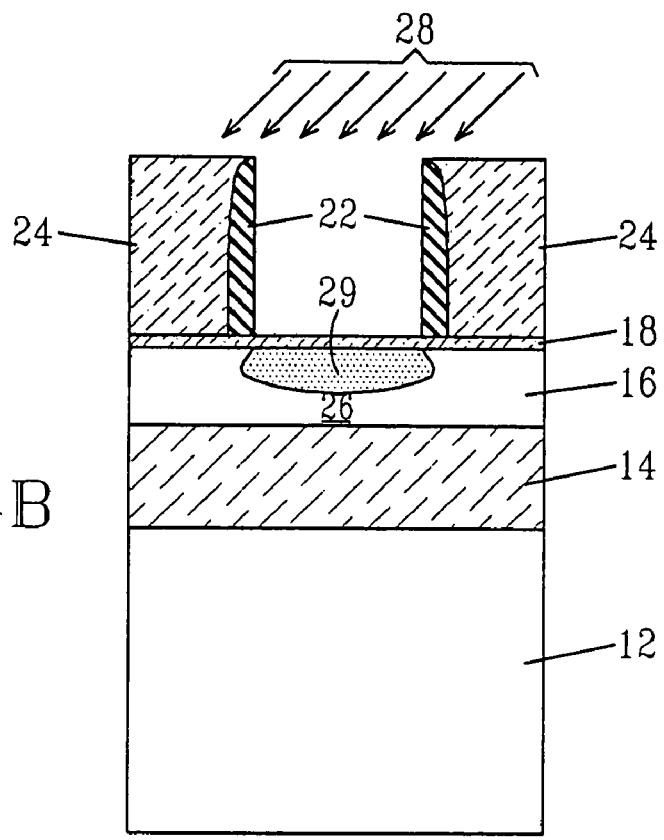
Figure 4C:
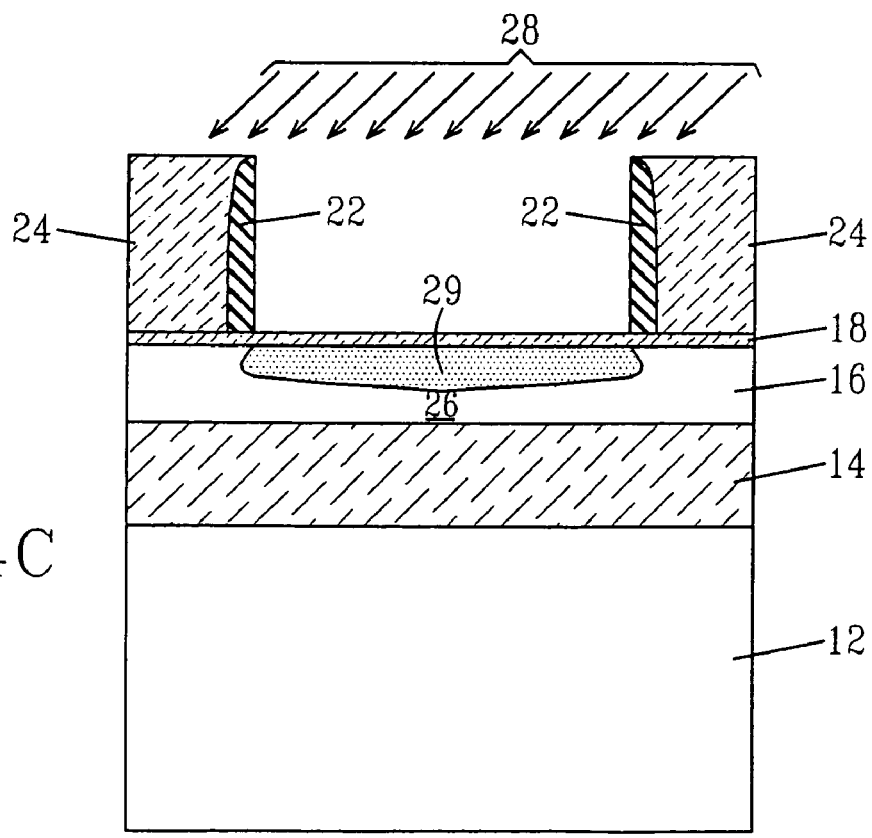

At this point of the present invention, ions such as nitrogen or fluorine are implanted into the device channel so as to modify the exposed SOI layer 16 in such a way that the implanted region retards or enhances oxidation during the subsequent recessed channel processing step. FIGS. 4A-4C show the ions 28 being implanted into the exposed SOI layer 16 for short, intermediate and long channel devices, respectively. In FIGS. 4A-4C, reference numeral 29 denotes the region of the SOI layer 16 that includes the implanted ions. Although various doses of ions can be implanted, the ions are typically implanted using an ion dosage from about 5E13 to about 5E14 atoms/cm$^2$. The depth and concentration of the implanted ions as a function of channel lengths can be designed by the implantation angle and the dummy gate height. There are more ions (nitrogen or fluorine) implanted in the SOI layer for longer channel devices. There are almost no ions implanted into the SOI layer for short channel devices due to the shadowing effect with angled implantation. Since oxidation is retarded (or enhanced) with the introduction of nitrogen (fluorine) implant, the recessed channel has a thinner (thicker) SOI film thickness for short channel lengths.

Figure 5A:
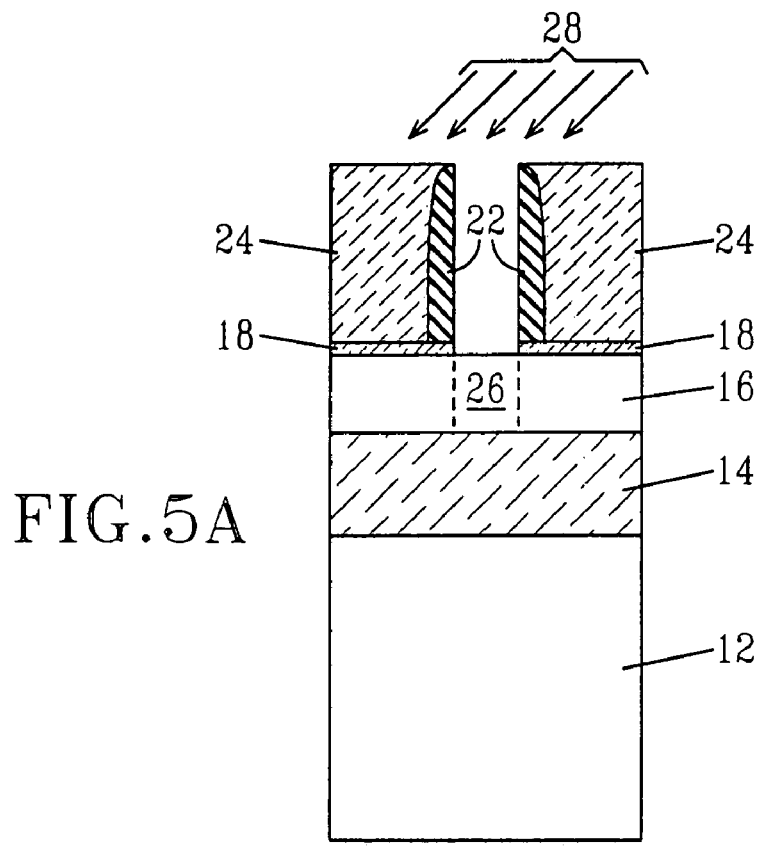
FIGS. 5A-5C are pictorial representations (through cross sectional views) illustrating the structure of FIG. 4 after removing the exposed sacrificial oxide layer; short, intermediate and long channel lengths, respectively, are shown.
Figure 5B:
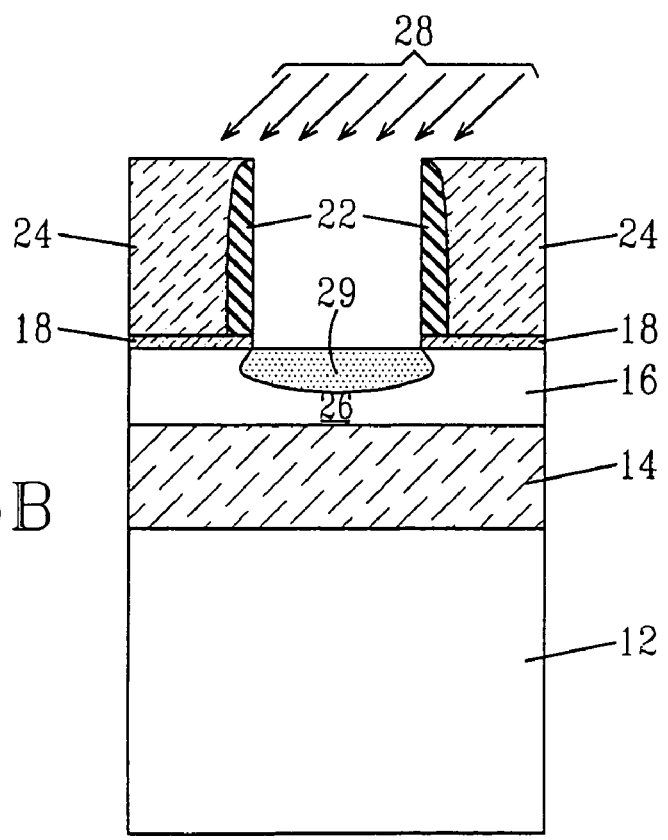
Figure 5C:
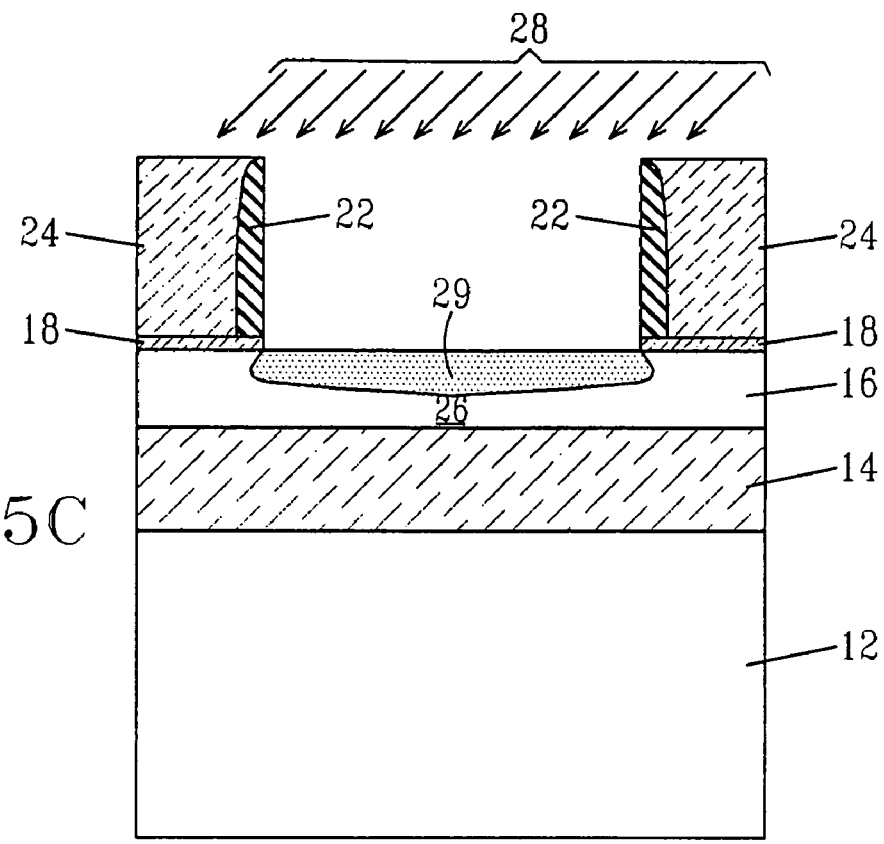

The exposed sacrificial oxide 18 in the gate opening 25 is then removed from the structure to expose the device channel 26 containing the implant region 29. Specifically, the exposed sacrificial oxide 18 in the gate opening is removed by utilizing a chemical oxide removal (COR) process. The COR process employed in the present invention is carried out at relatively low pressures (6 millitorr or less) in a vapor, or more preferably, a plasma of HF and NH$_3$. The HF and NH$_3$ mixture is used as an etchant that selectively removes oxide from the structure. The resultant structure that is formed after the COR step has been performed is shown, for example, in FIGS. 5A-5C.

Figure 6A:
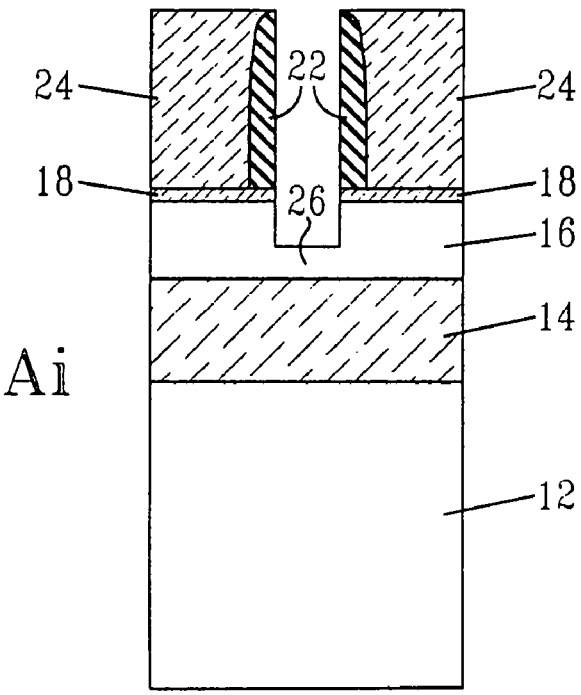
FIGS. 6Ai-6Ci and 6Aii-6Cii are pictorial representations (through cross sectional views) illustrating the structures of FIG. 5 after recessing the device channel.
Figure 6B:
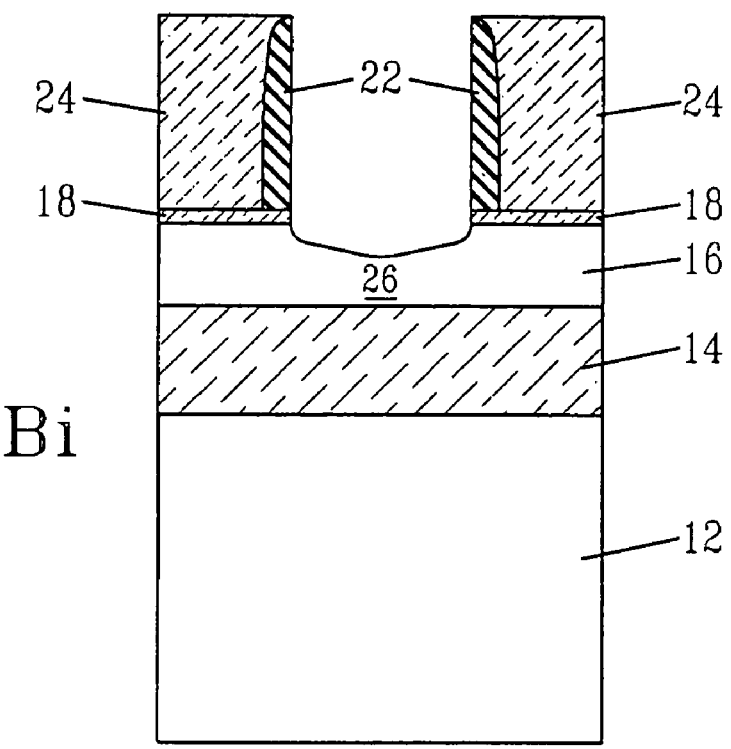
Figure 6C:
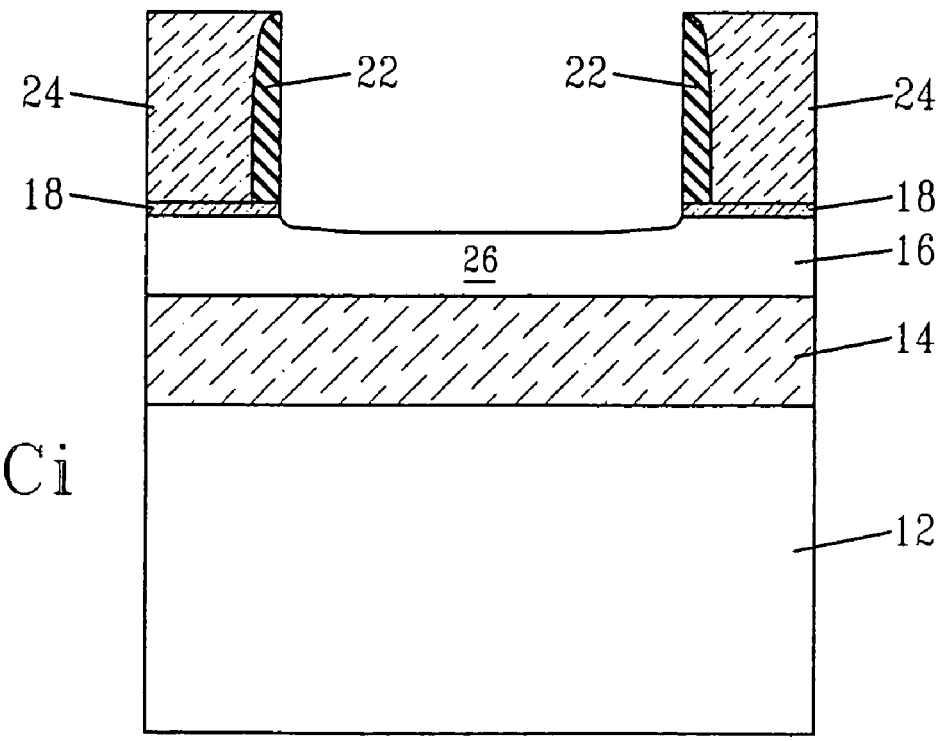

Next, and as shown in FIGS. 6Ai-6Ci and FIGS. 6Aii-6Cii, the exposed SOI layer 16 containing the implant region 29 is recessed, i.e., thinned, by utilizing an etching process that is capable of recessing, i.e., thinning the device channel 26. For example, successive steps of oxidation and etching via a COR processing step can be used to selectively recess the exposed SOI layer 16. FIGS. 6Ai-6Ci show device structures with three different channel lengths after nitrogen implant and recessing. Because oxidation is retarded by the introduction of nitrogen ions, the recessed channel SOI film thickness is thicker for longer channel lengths. This nitrogen implant process is appropriate for undoped (or counter doped) lengths. FIGS. 6Aii-6Cii show device structures with three different channel lengths after fluorine implantation and recessing. Because oxidation is enhanced by the introduction of implanted fluorine ions, the recessed channel SOI film is thinner for longer channel lengths. The fluorine implant process is appropriate for doped channel FDSOI MOSFETs.

The recessed device channel is designated by reference numeral 26 in the drawings. In accordance with the present invention, the recessed device channel 26 is an ultra thin body region of the SOI MOSFET structure. In particular, the recessed device channel 26 formed at this point of the present invention has a thickness of less than about 20 nm.

Next, gate dielectric 30 is formed atop the exposed recessed device channel 26 utilizing a conventional deposition process. Alternatively, the gate dielectric 30 may be formed by a thermal oxidation, nitridation or oxynitridation process. Combinations of the aforementioned processes may also be used in forming the gate dielectric 30. The gate dielectric 30 may be composed of any conventional dielectric including, but not limited to: $SiO_2$; $Si_3N_4$; SiON; $SiON_2$; high-k dielectrics such as $TiO_2$, $Al_2O_3$, $ZrO_2$, $HfO_2$, $Ta_2O_5$, $La_2O_3$; and other like oxides including perovskite-type oxides. Typically, the high-k dielectrics are capable of withstanding high-temperature (900° C.) anneals. Gate dielectric 30 may also comprise any combination of the aforementioned dielectric materials.

Gate dielectric 30 is typically thinner than the sacrificial oxide layer 18. Generally, when the gate dielectric 30 is composed of $SiO_2$, $Si_3N_4$, SiON or $SiON_2$, it has a thickness of about 1 to about 5 nm. For the other gate dielectrics, the thickness would provide an equivalent oxide thickness in the range mentioned above.

Figure 7A:
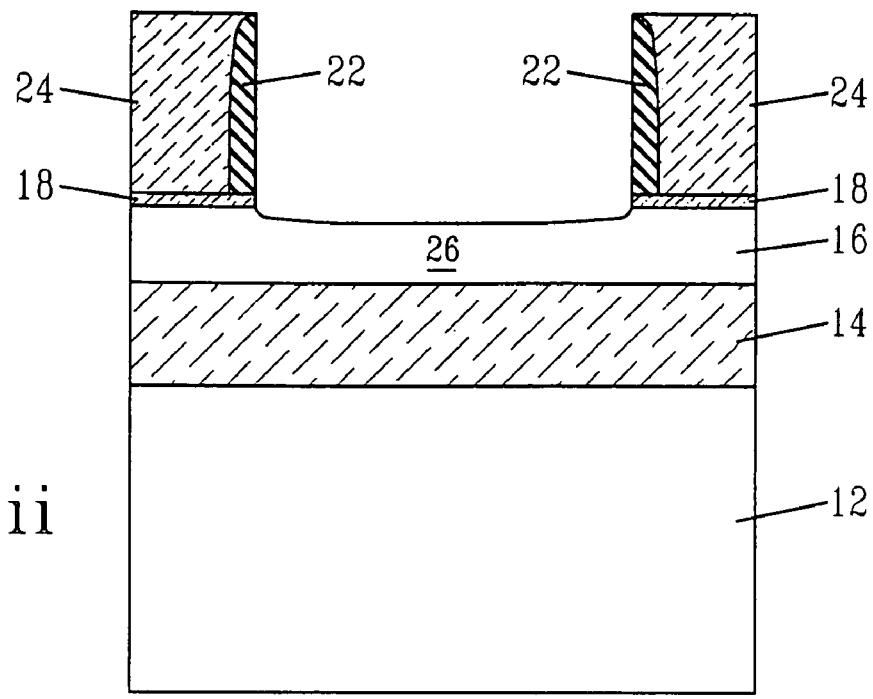
FIGS. 7A-7C are pictorial representations (through cross sectional views) illustrating the structure of FIGS. 6Ai-6Ci after gate formation and subsequent removal of the planarizing dielectric.
Figure 7A:
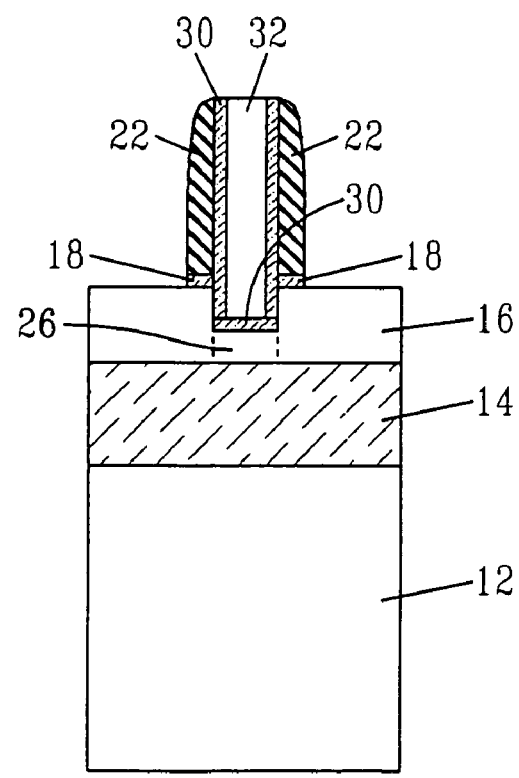
Figure 7B:
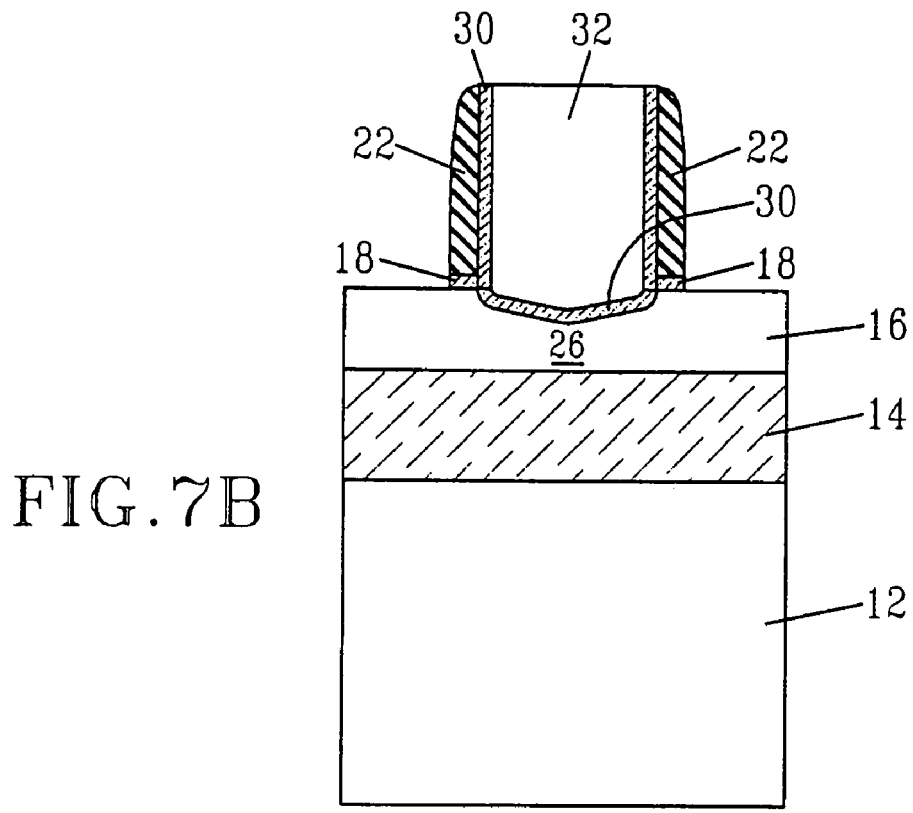
Figure 7C:
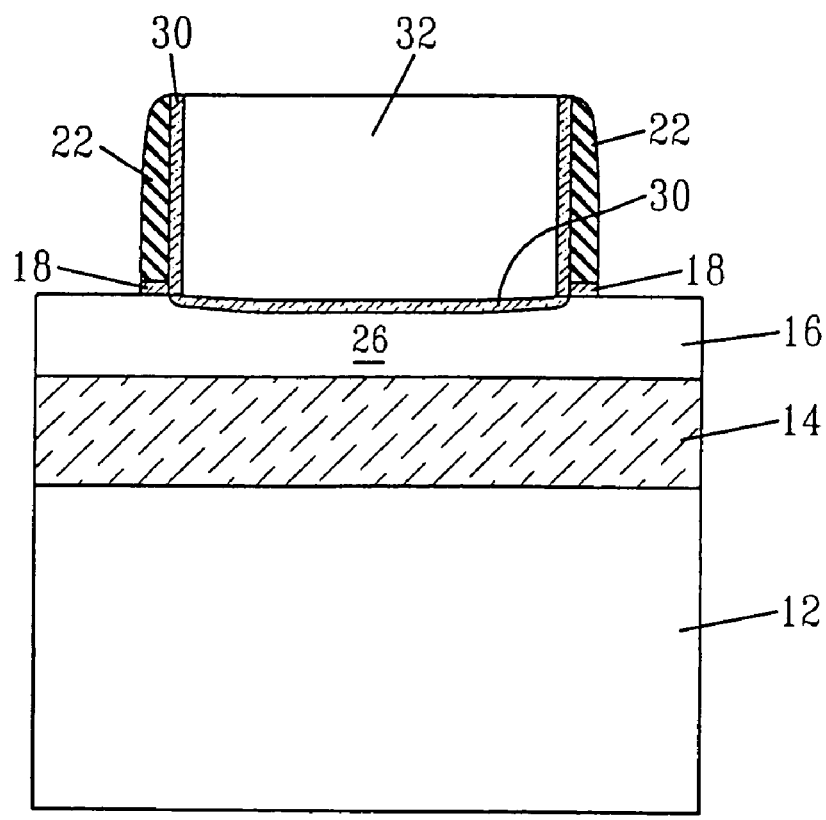

After forming the gate dielectric 30 atop the recessed device channel 26, a gate conductor 32, which serves as the gate electrode of the MOSFET, is formed providing the structure shown in FIGS. 7A-7C. Note that in FIGS. 7A-7C, the gate dielectric and gate conductor are formed on the recessed device channel shown in FIG. 6Ai-6Ci, respectively. Although this embodiment is depicted, the present invention also contemplates forming the gate dielectric and gate conducting on the recessed device channel depicted in FIGS. 6Aii-6Cii.

Gate conductor 32 is comprised of a conductive material including, but not limited to: elemental metals such as W, Pt, Pd, Ru, Re, Ir, Ta, Mo or combinations and multilayers thereof; silicides or nitrides of the aforesaid elemental metals; polysilicon either doped or undoped; and any combinations thereof. Typically, the gate conductor 32 is comprised of doped polysilicon.

Gate conductor 32 is formed utilizing a deposition process such as CVD, plasma-assisted CVD, sputtering, evaporation, chemical solution deposition and plating. When metal silicides are employed, a conventional silicidation process may be used in forming the same. On the other hand, when doped polysilicon is employed as the gate conductor 32, the doped polysilicon may be formed by an in-situ doping deposition process, or alternatively, a layer of undoped silicon is first deposited and thereafter an ion implantation process is employed in doping the undoped polysilicon. The doping of the undoped polysilicon may occur immediately after deposition or in a later processing step.

The physical thickness of gate conductor 32 formed at this point of the present invention may vary depending on the conductive material employed as well as the process used in forming the same. Typically, however, the gate conductor 32 has a thickness of from about 20 to about 400 nm, with a thickness of from about 50 to about 200 nm being more highly preferred.

Reference is still made to the structures shown in FIGS. 7A-7C in which the planarizing material 24 is removed from the structure after gate formation using an etching process that is highly selective in removing oxide. For example, KOH or an equivalent etchant can be used to remove the planarizing material. Note that exposed portions of the sacrificial oxide layer 18 underlying the planarizing material 24 are also removed during this step.

Figure 8A:
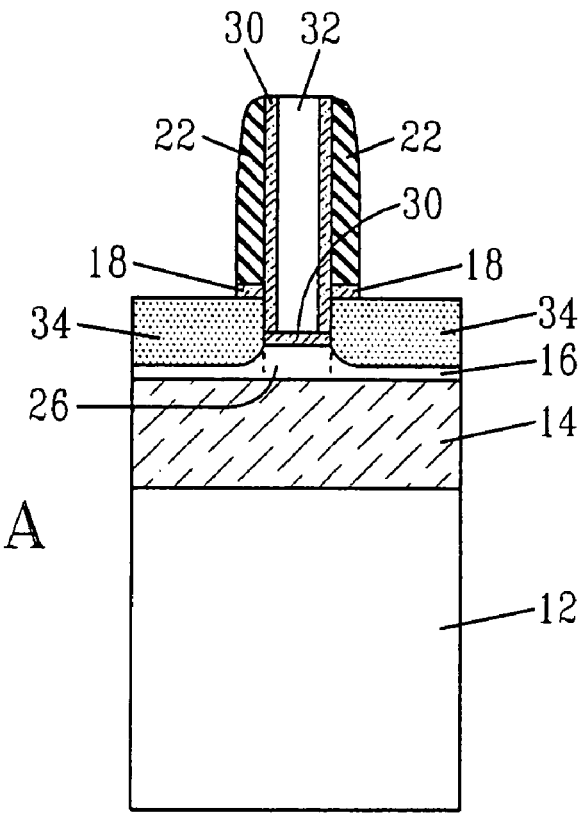
FIGS. 8A-8C are pictorial representations (through cross sectional views) illustrating the structure of FIGS. 7A-7C after forming source/drain diffusion regions in the recessed Si device channel.
Figure 8B:
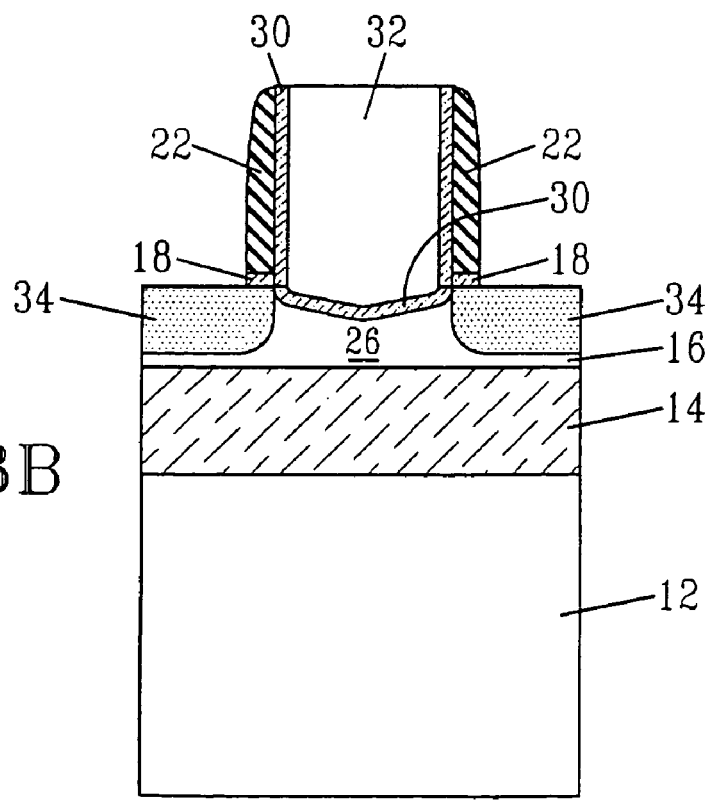
Figure 8C:
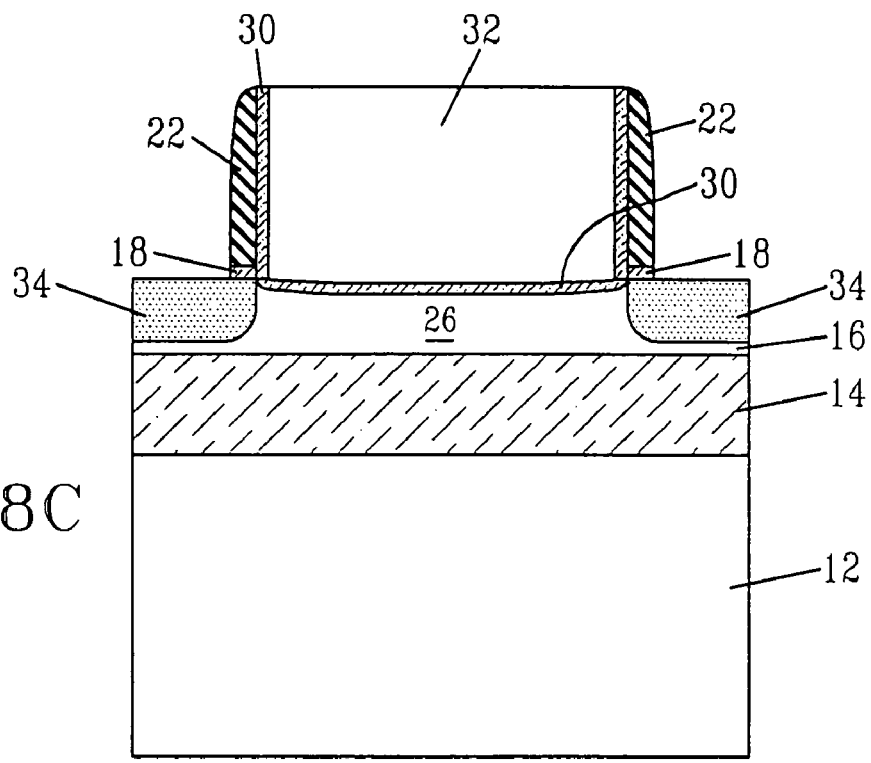

FIGS. 8A-8C show the structure after source/drain junctions (or regions) 34 are formed into the SOI layer 16 using a conventional angle implantation process followed by an annealing step. The implant is activated by annealing using conditions well known to those skilled in the art. For example, the implant may be annealed at 1000° C. for 1 second or longer.

At this point of the present invention, raised source/drain regions (not shown) may be optionally formed atop the surface of the source/drain regions by epitaxially growing an epi Si layer thereon. To either the raised source/drain regions or to the previously formed source/drain regions 34, salicide regions (not shown) may be formed using a conventional salicidation process that includes, for example, forming a refractory metal such as Ti, Co or Ni on Si surfaces; heating the structure to form silicide regions and thereafter removing any non-reactive metal that was not converted into a silicide during the heating process. In embodiments in which the gate conductor 32 is comprised of polySi, a salicide region also is formed thereon, unless appropriate steps (such as block mask formation) are taken to prevent the formation of a salicide region in the polysilicon gate conductor.

Further BEOL (back-end-of-the-line) processes may be formed on the structure shown in FIGS. 8A-8C. For example, a layer of insulating material such as BPSG (boron doped phosphorus silicate glass) can be formed over the structure by deposition and planarization. Contact openings can be formed into the insulating layer by lithography and etching and thereafter the contact holes can be filled with a conductive material, such as, for example, Cu, Al, W, polysilicon and other like conductive materials.

Figure 9:
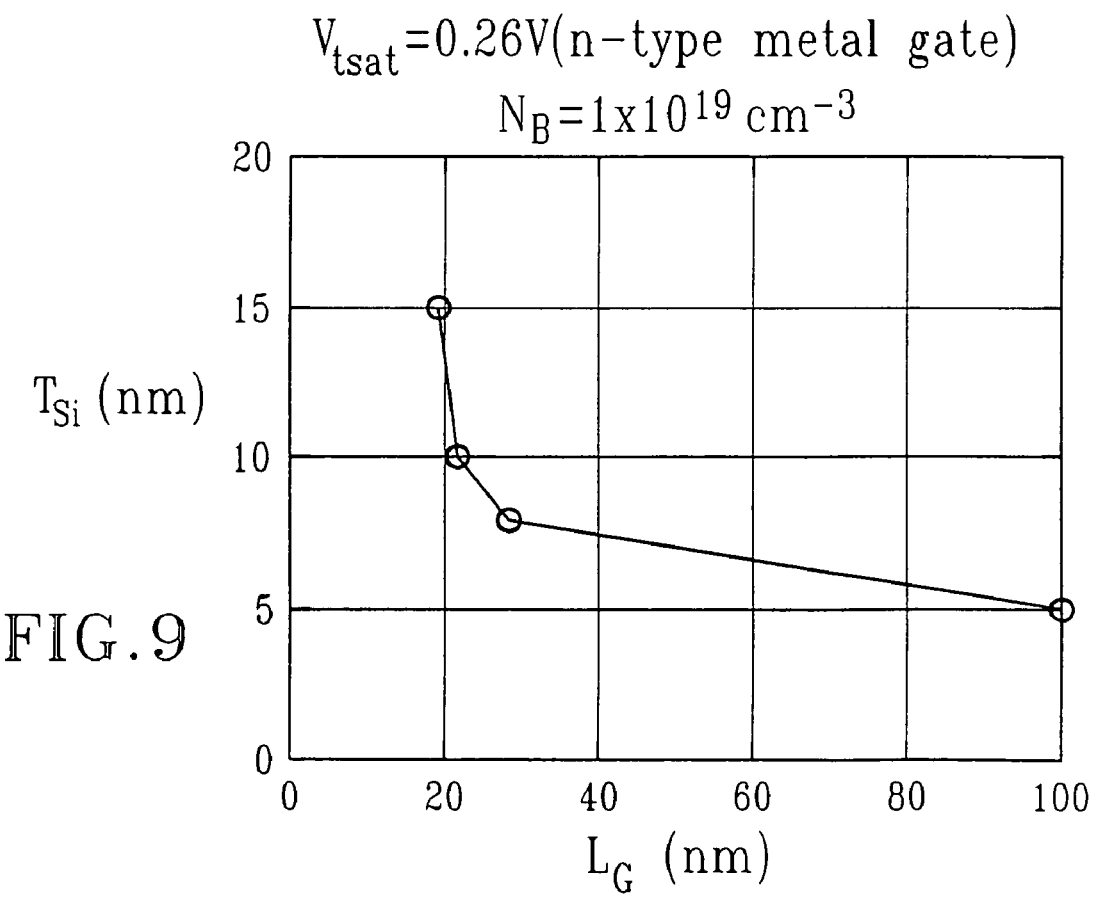
FIG. 9 is a plot of silicon thickness vs gate length.

A device example based on device simulation is shown in FIG. 9. For high channel doping, constant threshold voltage can be maintained provided that the SOI thickness is increased with the channel length according to the functional form shown in FIG. 9.

While the present invention has been particularly shown and described with respect to preferred embodiments thereof, it will be understood by one skilled in the art that the foregoing and other changes in form and detail may be made without departing from the spirit and scope of the present invention. It is therefore intended that the present invention not be limited to the exact forms and details described and illustrated, but fall within the scope of the appended claims.

What we claim is:

1. A silicon-on-insulator (SOI) metal oxide semiconductor field effect transistor (MOSFET) comprising:

a silicon-on-insulator (SOI) substrate having a SOI layer in which a first portion thereof has a thickness of less than about 20 nm;

a gate including a gate dielectric and a gate electrode located atop the first portion of the SOI layer having said thickness, said gate electrode having an upper surface and a bottom surface that have the same length or said bottom surface has a length that is greater than the upper surface; and source and drain diffusion regions located in a second portion of the SOI layer that is adjacent to said first portion, said second portion of the SOI layer is thicker than the first portion.

2. The SOI MOSFET of claim 1 further comprising an outer insulating spacer about the gate.

3. The SOI MOSFET of claim 1 wherein said gate conductor comprises doped polysilicon.

4. The SOI MOSFET of claim 1 further comprising an undoped or counter-doped device channel beneath said gate.

5. The SOI MOSFET of claim 1 further comprising a doped device channel beneath said gate.

6. The SOI MOSFET of claim 1 wherein said Si-containing layer is located on a surface of a buried oxide, said buried oxide having a thickness from about 100 nm to about 1000 nm.

7. A semiconductor structure comprising a plurality of fully-depleted metal oxide semiconductor field effect transistors (MOSFETs) located on a top Si-containing layer of a silicon-on-insulator substrate, wherein said top Si-containing layer under each MOSFET has a thickness that varies depending upon a gate length of each MOSFET, and each of said MOSFETS includes a gate electrode having an upper surface and a bottom surface that have the same length or said bottom surface has a length that is greater than the upper surface.

8. The semiconductor structure of claim 7 wherein each MOSFET comprises:
   a device channel in said top Si-containing layer having a vertical thickness of less than about 20 nm;
   a gate including a gate dielectric and said gate electrode located atop the device channel; and
source and drain diffusion regions located in said top Si-containing layer that is adjacent to said device channel, said top Si-containing layer adjacent to said device channel is thicker than the device channel.

9. The semiconductor structure of claim 8 further comprising an outer insulating spacer about the gate.

10. The semiconductor structure of claim 8 wherein said gate conductor comprises doped polysilicon.

11. The semiconductor structure of claim 7 wherein said some of said device channels are undoped or counter-doped.

12. The semiconductor structure of claim 7 wherein some of device channels are doped.

13. The semiconductor structure of claim 7 wherein said device channels of some of said pluralarity of MOSFET are undoped or counterdoped and the device channel of the other MOSFETs are doped.

14. The semiconductor structure of claim 7 wherein said top Si-containing layer is located on a surface of a buried oxide, said buried oxide having a thickness from about 100 nm to about 1000 nm.

15. A silicon-on-insulator (SOI) metal oxide semiconductor field effect transistor (MOSFET) comprising:
   a silicon-on-insulator (SOI) substrate having a SOI layer in which a first portion thereof has a thickness of less than about 20 nm, said SOI layer is located on a surface of a buried oxide having a thickness from 100 nm to about 1000 nm;
   a gate including a gate dielectric and a gate electrode located atop the first portion of the SOI layer having said thickness, said gate electrode having an upper surface and a bottom surface that have the same length or said bottom surface has a length that is greater than the upper surface;
   source and drain diffusion regions located in a second portion of the SOI layer that is adjacent to said first portion, said second portion of the SOI layer is thicker than the first portion; and
   an outer insulating spacer about the gate, said outer insulating spacer having an upper surface portion that is coplanar to the upper surface of said gate electrode, and is spaced apart from a vertical sidewall of said gate electrode by said gate dielectric.

16. The SOI MOSFET of claim 15 wherein said gate conductor comprises doped polysilicon.

17. The SOI MOSFET of claim 15 further comprising an undoped or counter-doped device channel beneath said gate.

18. The SOI MOSPET of claim 15 further comprising a doped device channel beneath said gate.

* * * * *